United States Patent
Chen et al.

(10) Patent No.: US 11,716,828 B1
(45) Date of Patent: Aug. 1, 2023

(54) ROTATABLE FASTENER MECHANISM FOR QUICK RELEASE OF COMPONENT TRAY

(71) Applicant: Quanta Computer Inc., Taoyuan (TW)

(72) Inventors: Chao-Jung Chen, Taoyuan (TW);
Kun-Pei Liu, Taoyuan (TW);
Ming-Lun Ku, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 0 days.

(21) Appl. No.: 17/833,242

(22) Filed: Jun. 6, 2022

Related U.S. Application Data (60) Provisional application No. 63/269,957, filed on Mar. 25, 2022.

(51) Int. Cl.
*H05K 7/14* (2006.01)
(52) U.S. Cl.
CPC .................. *H05K 7/1489* (2013.01)
(58) Field of Classification Search
None
See application file for complete search history.

(56) References Cited

U.S. PATENT DOCUMENTS

| | | | | |
|---|---|---|---|---|
| 5,090,840 | A | * | 2/1992 | Cosenza .............. H05K 7/1404 361/759 |
| 2008/0298009 | A1 | * | 12/2008 | Weng ....................... G06F 1/187 361/679.37 |
| 2016/0095240 | A1 | * | 3/2016 | Lei ........................ G06K 7/0056 361/679.02 |

FOREIGN PATENT DOCUMENTS

CN  113840482 A  * 12/2021

\* cited by examiner

*Primary Examiner* — James Wu
*Assistant Examiner* — Christopher L Augustin
(74) *Attorney, Agent, or Firm* — Nixon Peabody LLP (57) ABSTRACT

An expansion bay for a computer system having a rotatable fastening mechanism is disclosed. The expansion bay includes a bay housing having two facing side walls, a front open end and a bottom panel. A front tab and a rear tab extend from the interior of one of the side walls. A tray supporting an expansion component has a guide block with a threaded aperture. The tray may be positioned between an open position and a closed position. The rotatable fastener mechanism moves the tray into and out of the bay housing. A rod is inserted through apertures of the first tab and the second tab, allowing free rotation of the rod. The rod includes a threaded exterior section to rotationally engage the threaded aperture of the guide block. A knob is attached to an end of the rod to allow a user to rotate the rod and move the tray.

17 Claims, 7 Drawing Sheets

ROTATABLE FASTENER MECHANISM FOR QUICK RELEASE OF COMPONENT TRAY

CROSS-REFERENCE TO RELATED APPLICATIONS

This patent application claims the benefit of U.S. Provisional Patent Application No. 63/269,957, filed Mar. 25, 2022. The contents of that application in its entirety are hereby incorporated by reference.

TECHNICAL FIELD

The present disclosure relates generally to housings for computing devices. More particularly, aspects of this disclosure relate to a rotatable fastener mechanism that allows for simplified and quick positioning of a tray holding an expansion device for a computer system.

BACKGROUND

Computer systems (e.g., desktop computers, blade servers, rack-mount servers, etc.) are employed in large numbers in various applications. High demand applications, such as network based systems, data centers, or high density finite element simulations can push hardware of computing systems, require servers with specialized capabilities. Modern servers are typically designed to allow flexibility in terms of capabilities and components. One method is to design expansion bays that allows components such as cards, storage devices, processor boards and the like to be easily installed to enhance the basic capability of the server. An expansion bay will typically include trays that may support components. In order for easy service and changing components, many trays may be accessed without having to move the actual server chassis. For example, certain trays may slide out from the chassis, allowing the installation or removal of a component. Once installation is complete, the tray may be pushed back into the chassis.

Currently trays require a series of mechanical mechanisms to insure that the trays are locked into place. For example, certain trays have rotatable levers that allow an operator to move the lever to an open position to allow the tray to be slid out from the chassis and accessed. When the tray is loaded, it is pushed into the chassis, and the lever is rotated to the closed position. Such ejector levers are effective, however, they are relatively complex and require a certain amount of space. How to achieve easy service without ejector lever design on IO tray in limited available space. Therefore, this mechanism can simplify the design of tray as well as keep the same serviceability required in operation.

Thus, there is a need for a tray that may be easily moved between an open and a closed position. There is a further need for a simplified tray mechanism that allows the tray to be held solidly in a bay. There is a further need for a tray positioning mechanism that is compact.

SUMMARY

One disclosed example is an expansion bay assembly including a bay housing having two facing side walls, a front open end, and a bottom panel. A first tab having an aperture extends from the interior of one of the side walls. A tray has a guide block with a threaded aperture mounted between the side walls for supporting an expansion component. The tray is configured to be moved between an open position and a closed position. A rotatable fastener mechanism moves the tray between the open and the closed position. The rotatable fastener mechanism includes a rod inserted through the aperture of the first tab and rotationally engaging the threaded aperture of the guide block of the tray.

A further implementation of the example expansion bay assembly is an embodiment including a second tab extending from the interior of one of the walls. The second tab includes an aperture, and the rod is inserted through the aperture of the second tab. Another implementation is where the first tab is positioned in proximity to the front open end of the bay and the second tab is positioned in proximity to a closed end of the bay, opposite the open end. Another implementation is where the fastener mechanism includes a knob with grips on one end of the rod. Another implementation is where the tray includes a registration feature mating with the expansion component. Another implementation is where the expansion component is a peripheral component interconnect express (PCIe) compliant device. Another implementation is where the expansion component includes an edge connector mateable with a socket extending from an end wall of the bay.

Another disclosed example is a computer system including a chassis having two side walls, and a front end and a motherboard positioned in the chassis between the two side walls. A bay housing for holding an expansion component is mounted on the front end of the chassis. The bay housing includes two facing side walls; a front open end; and a bottom panel joining the two facing side walls. The bay housing includes a first tab having an aperture extending from the interior of one of the side walls. A tray having a guide block with a threaded aperture is mounted between the side walls for supporting the expansion component. The tray is moveable between an open position and a closed position. A rotatable fastener mechanism moves the tray between the open and closed position. The rotatable fastener mechanism includes a rod inserted through the aperture of the first tab and rotationally engaging the threaded aperture of the guide block of the tray.

A further implementation of the example computer system is an embodiment where the computer system is one of a storage server or an application server. Another implementation is where the bay includes a second tab extending from the interior of one of the walls. The second tab includes an aperture, and the rod is inserted through the aperture of the second tab. Another implementation is where the first tab is positioned in proximity to the front open end of the bay and the second tab is positioned in proximity to a closed end of the bay, opposite the open end. Another implementation is where the fastener mechanism includes a knob with grips on one end of the rod. Another implementation is where the tray includes a registration feature mating with the expansion component. Another implementation is where the expansion component is a peripheral component interconnect express (PCIe) compliant device. Another implementation is where the expansion component includes an edge connector mateable with a socket extending from an end wall of the bay.

Another disclosed example is an expansion bay for a computer system. The expansion bay includes a bay housing having two facing side walls, a front open end, a rear end, and a bottom panel. A first front tab having an aperture extends from the interior of one of the side walls in proximity to the front open end. A second rear tab having an aperture extends from the interior of one of the side walls in proximity to the rear end. A tray having a guide block with a threaded aperture is mounted between the side walls for supporting an expansion component. The tray configured to be moved between an open position and a closed position. A fastener mechanism is operable to move the tray between the open and closed position by rotation of the fastener mechanism. The fastener mechanism includes a rod inserted through the apertures of the first tab and the second tab, allowing free rotation of the rod. The rod includes a threaded exterior section between the first and second tabs to rotationally engage the threaded aperture of the guide block of the tray. The fastener mechanism includes a knob attached to an end of the rod extending from the front open end of the bay housing.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a rotatable fastener mechanism that allows a tray for an expansion component to be easily positioned between an open and closed position in a bay. One of the side walls of the bay has two mounting tabs that suspend a rotatable rod. One end of the rod is located on the exterior of the bay housing and is attached to a knob shaped screw fastener. The screw fastener may be rotated by a user and thus rotates the rod. The tray includes a linear traversing block that engages a threaded section of the rod. Thus, the traversing block may traverse between an open position and a closed position relative to the rod when the rod is rotated. The attached tray is therefore guided between the open and closed position by the rotational movement of the rod.

Figure 1A:
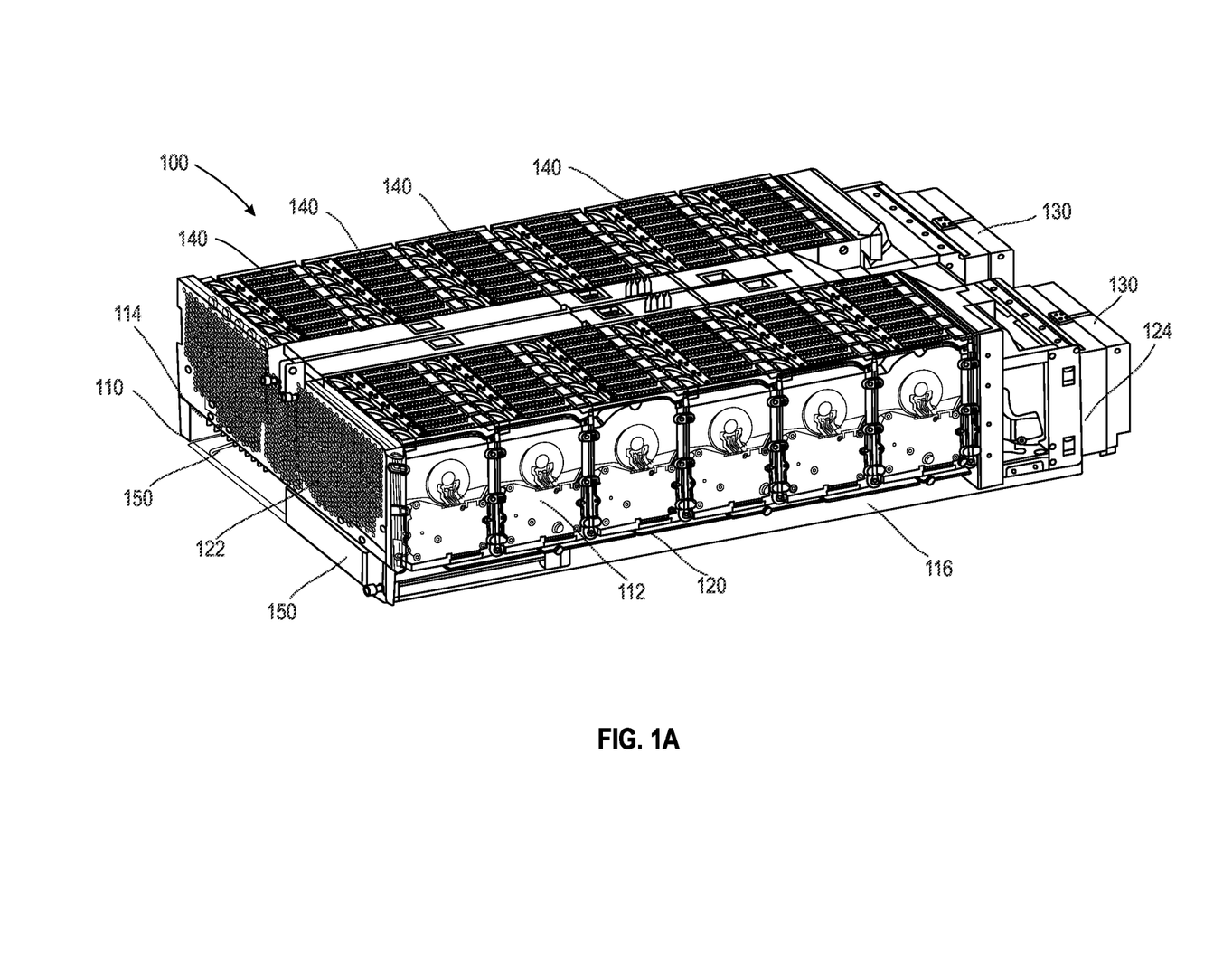
FIG. 1A is a perspective view of a computer system with example tray structures for holding expansion devices.

FIG. 1A is a perspective view of a computer system or computer device such as a storage server 100. The storage server 100 includes a chassis 110 with two side walls 112 and 114. The side walls 112 and 114 are joined by a bottom panel 116. A motherboard 120 is mounted between the side walls 112 and 114. The motherboard 120 is fixed between a front panel 122 and a rear panel 124 of the chassis 110. The motherboard 120 includes one or more components such as power supplies, processors such as CPUs, network interface cards, memory devices, and the like. A set of fan modules 130 are located near the rear of the chassis 110. The fan modules 130 generates air flow between the side walls 112 and 114 to assist in cooling the components of the storage server 100. The fan modules 130 are configured to set a direction for the incoming air flow and the outgoing air flow, such that both the incoming air flow and the outgoing air current flow move in a same direction.

In this example, the chassis 110 holds banks of hard disk drives (HDDs) 140 that are arranged in rows. In this example, there are two parallel banks of individual hard drives that are connected to the motherboard 120. Each bank has six rows of six individual hard drives 140 for a total of 72 HDDs. In this example, the hard disk drives may be replaced by solid state drives (SSDs). A storage control board is contained in a housing between the two banks of individual hard drivers 140.

The front panel 122 includes two bay assemblies 150 that allow the insertion of expansion component form factors. In this example, two bay assemblies 150 are provided, but any number of bay assemblies may be supported by different structures of the front panel 122. Each of the bay assemblies 150 allows for access to an expansion component such as an Input Output (IO) module that includes an IO board with a peripheral component interconnect express (PCIe) form factor to dock to the connector socket 226 (shown in FIG. 2). For example, there may be power button/reset button/debug USB components located at front side of IO board in this form factor. Other types of computer devices such as an application server may have fewer storage devices and more bay assemblies for more expansion cards. The example bay assemblies using the rotatable fastener mechanism may be used for any suitable computer device such as storage devices (e.g., JBODs), switches, or the like.

Figure 1B:
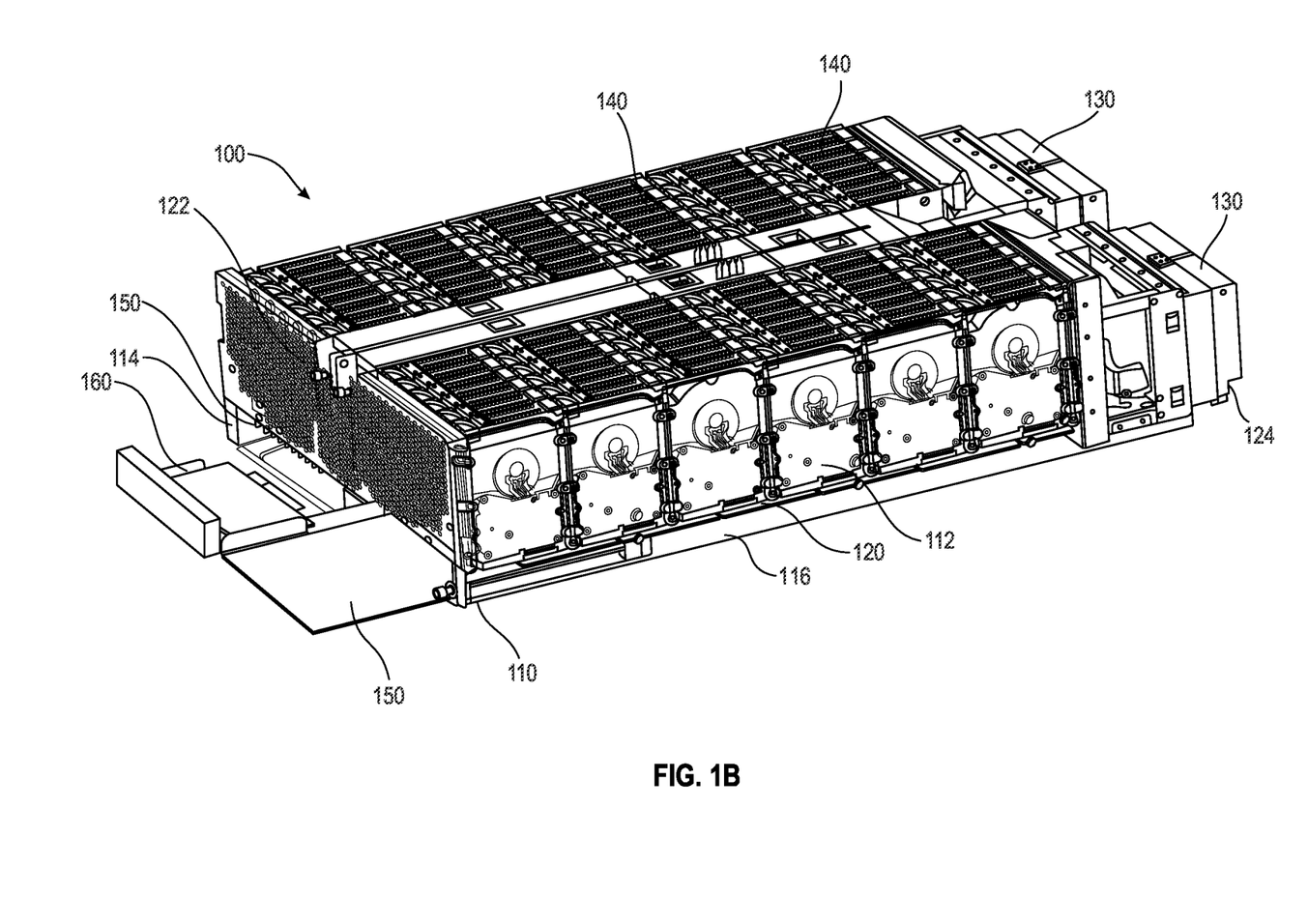
FIG. 1B is a perspective view of a computer system with an example open tray structure for holding an expansion device.

FIG. 1B shows the storage server 100, where one of the bay assemblies 150 is in an open state. The open state allows the insertion of an expansion component 160 on an extended tray. The expansion component 160 conforms to a specific card form factor design such as a peripheral component interconnect express (PCIe) form factor that is compliant with PCIe standards. As will be explained, the bay assembly 150 includes the tray that may be moved to an open position via a rotatable fastening mechanism. Once the tray is open, expansion components having compatible card form factors such as the expansion component 160 may be inserted for installation in the storage server 100. The tray may then be moved to a closed position via the rotatable fastening mechanism. When the tray is in the closed position, the expansion component 160 may be connected to the motherboard 120 and provide additional functionality to the storage server 100.

Figure 2:
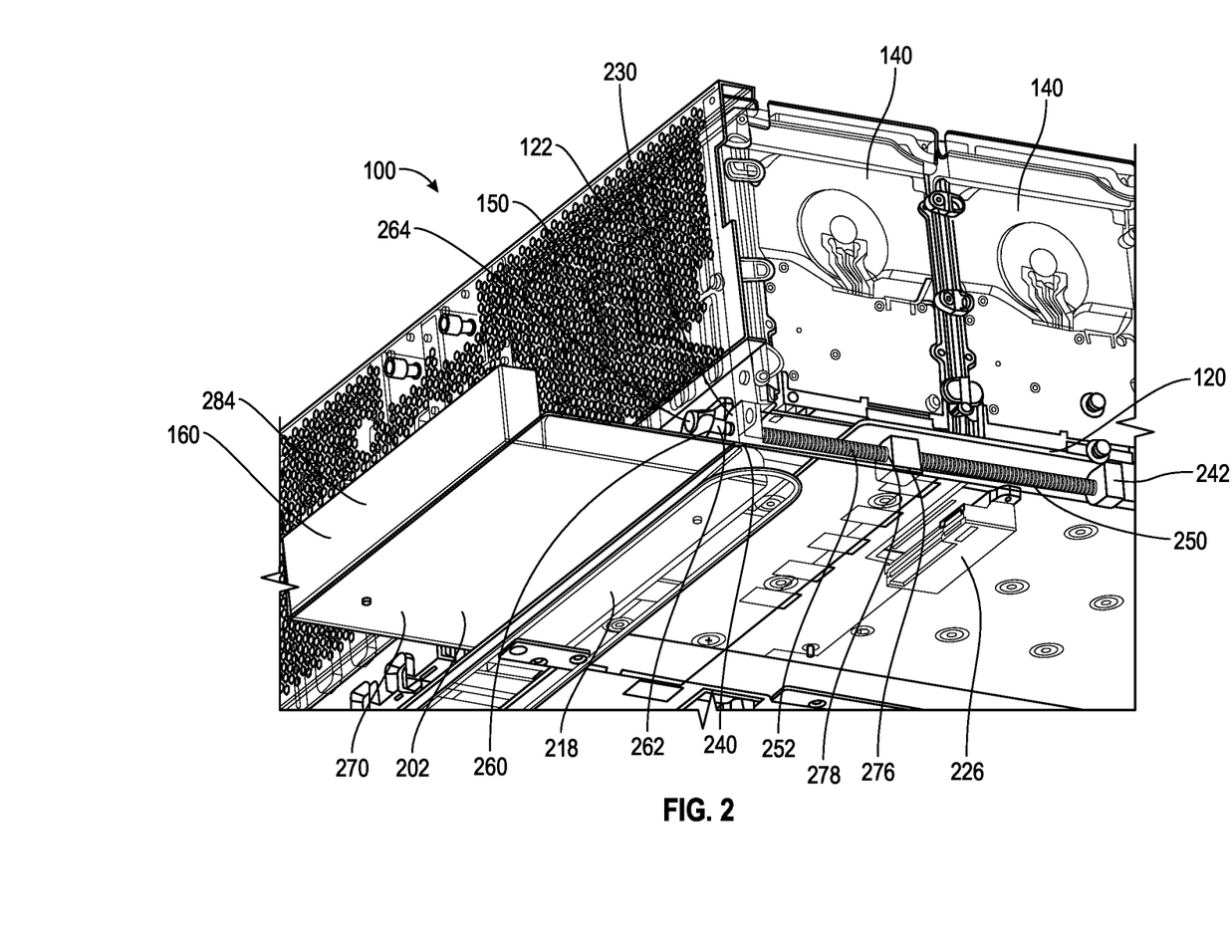
FIG. 2 is an isolated perspective view of the example rotatable fastening mechanism and tray partially inserted in a bay of the computer system of FIG. 1A.
Figure 3:
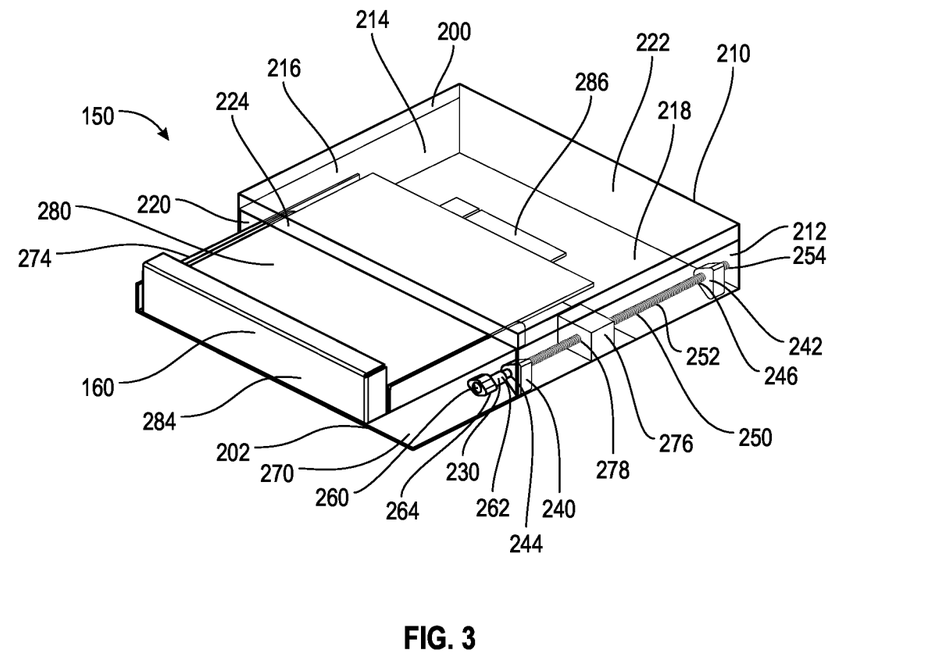
FIG. 3 is a perspective view of the example rotatable fastening mechanism and tray partially inserted in a bay of the computer system of FIG. 1A.
Figure 4:
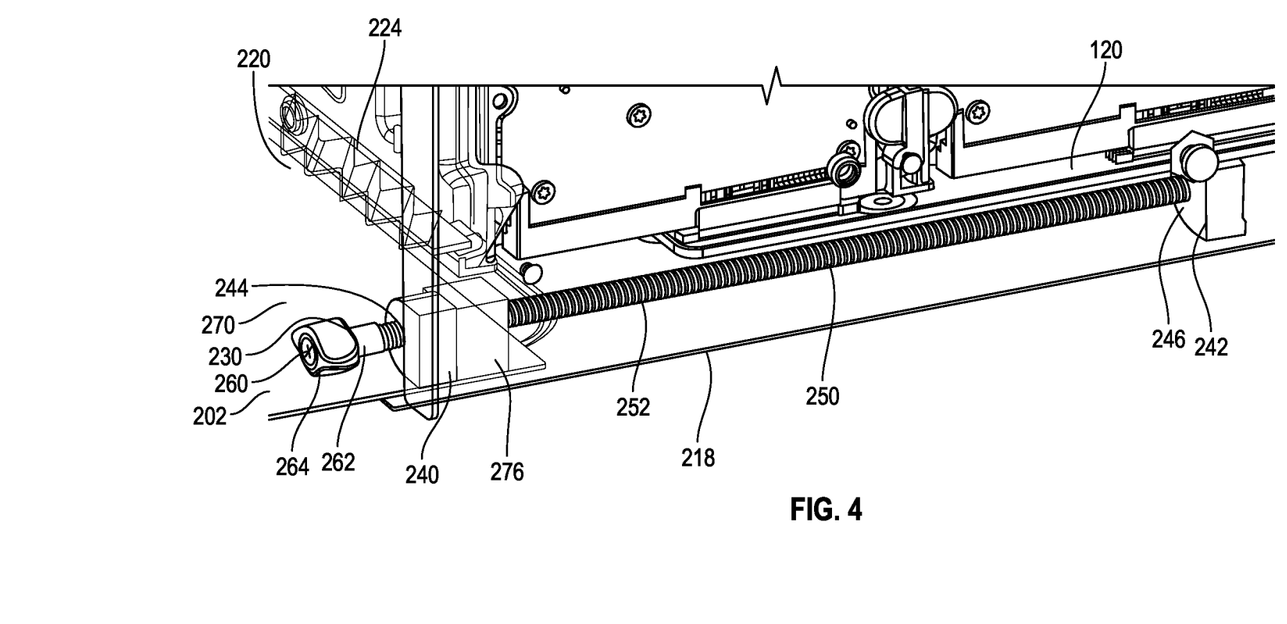
FIG. 4 is a close-up perspective view of the example rotatable fastening mechanism.
Figure 5:
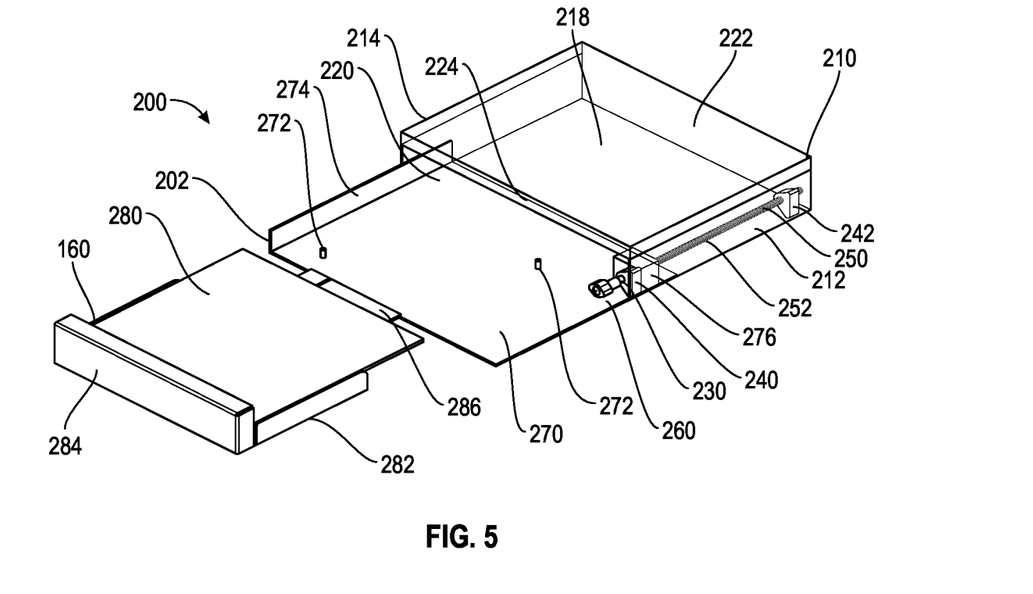
FIG. 5 is an exploded perspective view of the example tray and rotatable fastening mechanism.

FIG. 2 is a perspective view of one of the bay assemblies 150 in FIGS. 1A-1B installed in a computer system such as the storage server 100. FIG. 3 is an isolated perspective view of one of the bay assemblies 150 in FIG. 1A-1B. FIG. 4 is a close up perspective view of the example fastening and tray positioning mechanism in FIG. 1A-1B. FIG. 5 is an isolated exploded perspective view of the example fastening and tray positioning mechanism of the bay assembly 150.

Referencing FIGS. 2-5, the bay assembly 150 has a bay 200, a tray 202, and the expansion component 160. In this example, the expansion component 160 is a PCIe device, but any device with a form factor that may be fit within the dimensions of the bay 200 may be used. The dimensions and relevant components of the bay 200 may be adjusted to accommodate other form factors. The bay 200 has a bay housing 210 with two opposite side walls 212 and 214. The side walls 212 and 214 are joined to a top panel 216 and a bottom panel 218. The bay housing 210 has an open end 220 defined by the side walls 212 and 214 and the top and bottom panels 216 and 218. A front cross member 224 joins the side walls 212 and 214 and defines the open end of the bay housing 210. An opposite closed end 222 has a connector socket 226 extending therethrough that interfaces with the expansion component 160. In this example, the connector socket 226 is a PCIe type socket that is attached to the bottom surface of the motherboard 120.

The tray 202 may be moved between a closed position that allows the tray 202 to be entirely enclosed by the bay housing 210, and an open position that allows the expansion component 160 to be removed from the tray 202. The tray 202 may be extended so almost the entirety of the tray 202 is accessible outside of the bay housing 210. When the tray 202 is extended, the expansion component 160 is accessible by a user. In this example, a rotatable fastener mechanism 230 is provided for guiding the tray 202 between the open and closed position.

In this example, the rotatable fastener mechanism 230 engages a front tab 240 and a rear tab 242 that are attached to the interior surface of the side wall 212 facing the side wall 214. The two tabs 240 and 242 extend from the interior surface of the side wall 212. As shown in FIGS. 2-4, the front tab 240 is located near the open end 220 of the bay housing 210 and the rear tab 242 is located near the closed end 222 of the bay housing. Both of the tabs 240 and 242 have a guide hole 244 and 246 respectively extending therethrough. The rotatable fastener mechanism 230 includes a rod 250 that is inserted through the guide holes 244 and 246 and is thus held by the tabs 240 and 242 in a parallel position to the side wall 212.

The rod 250 has an exterior middle threaded section 252 between end sections that have smooth exterior surfaces. The rod 250 thus may freely rotate in the guide holes 244 and 246 of the tabs 240 and 242 via the sections with the smooth exterior surfaces that are positioned in the guide holes 244 and 246 when the rod 250 is properly positioned. One end of the rod 250 positioned near the closed end 222 includes a cap 254 having a larger diameter than the guide hole 246 of the rear tab 242 that prevents the rod 250 from being pulled out of the guide hole 246. The opposite end of the rod 250 positioned near the open end 220 includes a screw fastener assembly 260.

The screw fastener assembly 260 includes a cylindrical support 262 that has an open end. The cylindrical support 262 may be slipped over the opposite end of the rod 250. The cylindrical support 262 has a larger diameter than the guide hole 244 of the front tab 240 and when attached to the end of the rod 250 prevents the rod 250 from being pulled out of the guide hole 244. The cylindrical support 262 has a closed end attached to a winged knob member 264 that may be gripped and rotated by a user to move the tray 202 between the open and closed position.

The tray 202 has a generally flat bottom panel 270 that has registration features 272 such as pins for engaging the expansion component 160. The bottom panel 270 has a front edge and an opposite rear edge. In this example, the expansion component 160 will have slots that fit the pins 272 to position the expansion component 160 relative to the bottom panel 270. Although two pins are used in this example, any number of pins or other mechanisms may be used to engage and align the expansion component 160 in position on the bottom panel 270. In addition, the bottom panel 270 may have slots as registration features and the expansion component 160 may have pins that fit within the slots.

The bottom panel 270 is connected to a side panel 274 that is generally parallel to the side wall 214 of the bay housing 210 and extends between the front and rear edges of the bottom panel 270. The side panel 274 also serves to position the expansion component 160 relative to the tray 202. A linear traversing guide block 276 is mounted on an open side of the bottom panel 270 opposite the side panel 274. The guide block 276 is located near the rear edge of the tray 202. The guide block 276 has an aperture 278 therethrough that is generally cylindrically shaped. The aperture 278 has a threaded interior surface that engages the threaded section 252 of the rod 250.

In this example, the expansion component 160 has a circuit board 280 that is mounted on a housing 282 having a front block 284. One edge of the circuit board 280 is fixed near the front block 284. The opposite edge of the circuit board 280 includes an edge connector 286 that may be inserted a corresponding socket 226 connected to the bottom surface of the motherboard 120. The circuit board 280 has electronic components such as controllers, memory devices, interfaces, and circuits and the like.

The rod 250 may be rotated by a user gripping the knob member 264 and rotating the knob member 264 causing the rod 250 to rotate. When the rod 250 is rotated in one direction, such as clockwise, the threaded section 252 engages the interior threads of the aperture 278 of the linear traversing guide block 276. The linear traversing guide block 276 thus is moved relative to the rod 250. The attached tray 202 is thus moved into the bay 200 by the movement of the guide block 276.

When the rod 250 is rotated in the opposite direction, counter-clockwise, the threaded section 252 of the rod 250 engages the interior threads of the aperture 278. The linear traversing guide block 276 thus moves relative to the rod and the tray 202 is moved away from the bay 200. The linear traversing guide block 276 may thus be moved between a fully closed position where the linear traversing guide block 276 rests against the rear tab 242 and a fully open position. In the closed position, the rear tab 242 thus stops further movement of the linear traversing guide block 276 and attached tray 202 toward the rear end 222 of the bay 200. In the open position, the forward tab 240 stops the movement of the linear traversing guide block 276 toward the open end 220 of the bay 200.

Figure 6:
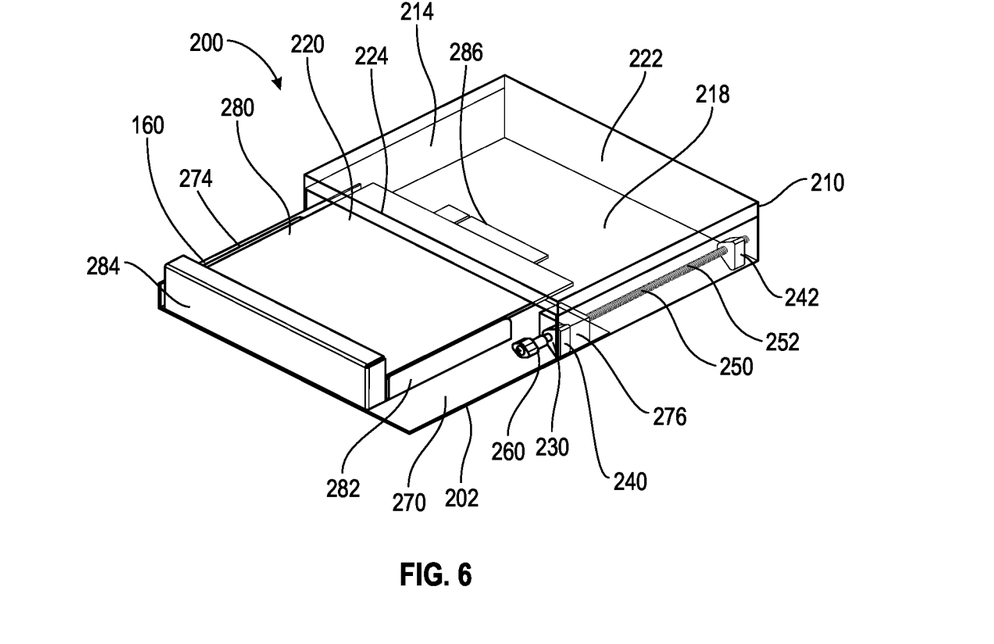
FIG. 6 is a perspective view of the example rotatable fastening mechanism and tray fully extended from the bay.

FIG. 6 is a perspective view of the example tray 202 in FIGS. 2-5 in a fully open extended position. In this example, the linear traversing guide block 276 is abutting the forward tab 240 extending from the side wall 212 of the bay housing 210. Since the tray 202 is fully extended, the expansion component 160 may be inserted on the tray 202 by aligning the slots with the guide pins 272 on the bottom panel 270. Alternatively, the expansion component 160 may be removed from the tray 202 in the open position. Once the expansion component 160 is positioned on the tray 202 via mating slots with the registration features 272 in FIG. 5, the tray 202 may be moved to the closed position by rotating the rod 250 through the knob member 264.

The user may grip the knob member 264 and rotate the rod 250 in a clockwise direction. The threaded section 252 engages the interior threads of the aperture 278 of the block 276 and translates into linear motion of the guide block 276. The tray 202 thus moves into the bay 200. The rod 250 may be rotated clockwise until the guide block 276 contacts the rear tab 242. When the guide block 276 contacts the rear tab 242, the edge connector 286 is inserted fully into the socket 226 and allows electrical signal communication between the expansion component 160 and components on the motherboard 120.

Figure 7:
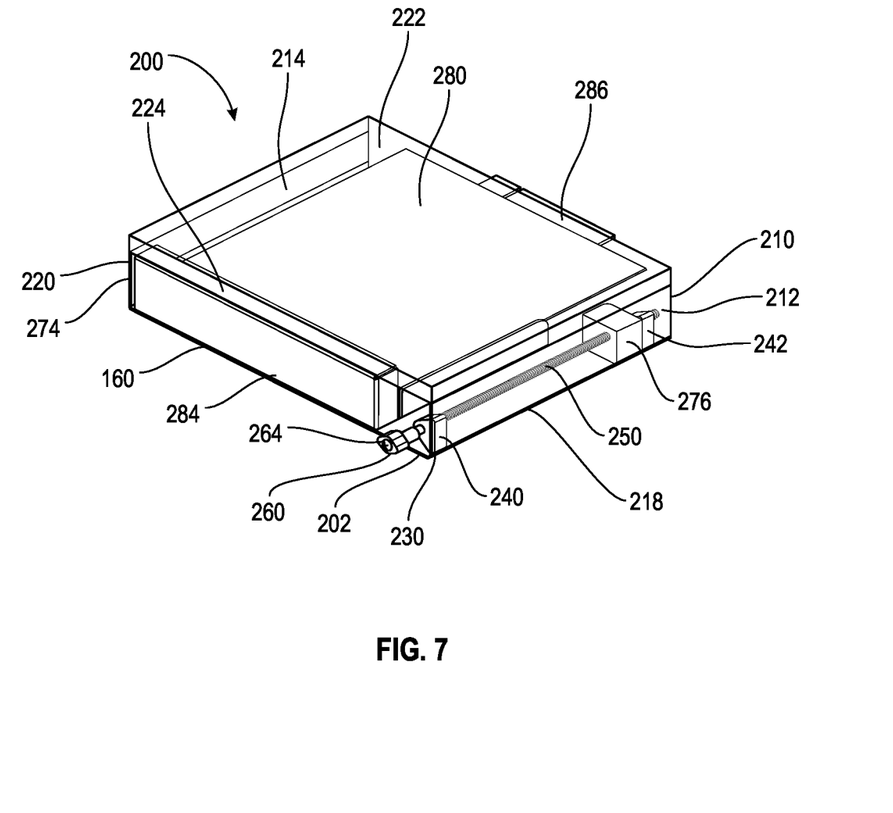
FIG. 7 is a perspective view of the example tray in a fully open position.

FIG. 7 is a perspective view of the example tray 202 in a fully closed position where the linear traversing guide block 276 is in contact with the rear tab 242. In this position, the edge connector 286 of the expansion component 160 is inserted in the socket 226 extending through the closed end 222. The tray 202 is entirely contained within the bay 200, and the expansion component 160 is electrically coupled to the components of the motherboard 120. As explained above, in order to open the tray 202, a user rotates the knob 264 causing the rod 250 to rotate and move the linear traversing guide block 276 and the attached tray 202 and card 160 out of the bay 200. The edge connector 286 is pulled out of the socket 226 during the motion of the tray 202.

The above described rotatable fastening mechanism 230 allows easy service of the expansion cards such as the expansion card 160 in the tray 202. The bay 200 and rotatable fastener mechanism 230 may be installed in limited available space on the side wall of a bay. The rotatable fastener mechanism 230 allows a simplified tray design that only requires registration features such as pins to engage and release the mating features of the expansion component 160. The rotatable fastener mechanism 230 also does not require any specialized tools to fix the tray 202 and the expansion component 160 in place in the bay assembly 150 or to extend the tray and access the expansion component 160.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. An expansion bay assembly comprising:
   a bay housing having two facing side walls, a front open end, and a bottom panel;
   a first tab having a first aperture, the first tab extending from the interior of one of the side walls;
   a tray having a guide block with a threaded aperture, the guide block being mounted between the side walls for supporting an expansion component, the tray being configured to be moved between an open position and a closed position; and
   a rotating fastener mechanism configured to move the tray between the open and the closed position, the rotating fastener mechanism including a rod inserted through the first aperture of the first tab and rotationally engaging the threaded aperture of the guide block.

2. The expansion bay assembly of claim 1, further comprising a second tab extending from the interior of one of the side walls, wherein the second tab includes a second aperture, and wherein the rod is inserted through the second aperture of the second tab.

3. The expansion bay assembly of claim 2, wherein the first tab is positioned in proximity to the front open end of the bay housing and the second tab is positioned in proximity to a closed end of the bay housing, opposite the front open end.

4. The expansion bay assembly of claim 1, wherein the fastener mechanism includes a knob with grips on one end of the rod.

5. The expansion bay assembly of claim 1, wherein the tray includes a registration feature mating with the expansion component.

6. The expansion bay assembly of claim 1, wherein the expansion component is a peripheral component interconnect express (PCIe) compliant device.

7. The expansion bay assembly of claim 1, wherein the expansion component includes an edge connector mateable with a socket extending from an end wall of the bay housing.

8. A computer system comprising:
a chassis having two side walls, and a front end;
a motherboard positioned in the chassis between the two side walls; and
a bay housing for holding an expansion component mounted on the front end of the chassis, the bay housing including:
two facing side walls;
a front open end;
a bottom panel joining the two facing side walls;
a first tab having a first aperture, the first tab extending from the interior of one of the side walls;
a tray having a guide block with a threaded aperture mounted between the side walls for supporting the expansion component, the tray moveable between an open position and a closed position; and
a rotating fastener mechanism configured to move the tray between the open and closed position, the fastener mechanism including a rod inserted through the first aperture of the first tab and rotationally engaged with the threaded aperture of the guide block.

9. The computer system of claim 8, wherein the computer system is one of a storage server or an application server.

10. The computer system of claim 8, wherein the bay includes a second tab on the interior of one of the walls, wherein the second tab includes a second aperture, and wherein the rod is inserted through the second aperture.

11. The computer system of claim 10, wherein the first tab is positioned in proximity to the front open end of the bay housing and the second tab is positioned in proximity to a closed end of the bay housing, opposite the front open end.

12. The computer system of claim 8, wherein the fastener mechanism includes a knob with grips on one end of the rod.

13. The computer system of claim 8, wherein the tray includes a registration feature mating with the expansion component.

14. The computer system of claim 8, wherein the expansion component is a peripheral component interconnect express (PCIe) compliant device.

15. The computer system of claim 8, wherein the expansion component includes an edge connector mateable with a socket extending from an end wall of the bay housing.

16. An expansion bay for a computer system, the expansion bay comprising:
a bay housing having two facing side walls, a front open end, a rear end, and a bottom panel;
a first front tab having a first aperture, the front tab extending from the interior of one of the side walls in proximity to the front open end;
a second rear tab having a second aperture, the rear tab extending from the interior of one of the side walls in proximity to the rear end;
a tray having a guide block with a threaded aperture mounted between the side walls for supporting an expansion component, the tray configured to be moved between an open position and a closed position; and
a fastener mechanism operable to move the tray between the open and the closed position in response to rotation of the fastener mechanism, the fastener mechanism including a rod inserted through the first and second apertures of the first tab and the second tab, allowing free rotation of the rod, wherein the rod includes a threaded exterior section between the first and second tabs to rotationally engage the threaded aperture of the guide block, and the rod further having a knob attached to an end of the rod extending from the front open end of the bay housing.

17. The expansion bay of claim 16, further comprising a socket extending from the rear end of the bay housing, wherein the expansion component includes a circuit board with an edge connector mateable with the socket when the tray is in the closed position.

* * * * *